United States Patent
Chiu et al.

(10) Patent No.: US 8,564,374 B2
(45) Date of Patent: Oct. 22, 2013

(54) OSCILLATOR CALIBRATION APPARATUS AND OSCILLATOR CALIBRATION METHOD

(75) Inventors: Chun-Yu Chiu, Tainan (TW); Yaw-Guang Chang, Tainan (TW); Meng-Wei Shen, Tainan (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 0 days.

(21) Appl. No.: 13/252,171

(22) Filed: Oct. 3, 2011

(65) Prior Publication Data
US 2013/0082784 A1   Apr. 4, 2013

(51) Int. Cl.
*H03L 7/06* (2006.01)
*H03L 7/183* (2006.01)

(52) U.S. Cl.
USPC ................................ 331/44; 331/25; 331/1 R

(58) Field of Classification Search
CPC .................................. H03K 23/42; H03K 3/78
USPC ....... 331/10, 11, 16, 179, 1 R, 44, 17, 34, 25, 331/36 C, 46, 47; 327/156
See application file for complete search history.

(56) References Cited

U.S. PATENT DOCUMENTS

| | | | | |
|---|---|---|---|---|
| 5,023,572 | A * | 6/1991 | Caldwell et al. | 331/10 |
| 6,005,447 | A * | 12/1999 | Huang | 331/44 |
| 7,982,549 | B1 * | 7/2011 | Husted et al. | 331/175 |
| 2003/0210083 | A1 * | 11/2003 | Bazes | 327/155 |
| 2003/0231021 | A1 * | 12/2003 | Alwardi et al. | 324/360 |
| 2004/0113704 | A1 * | 6/2004 | Ho | 331/1 A |
| 2005/0093638 | A1 * | 5/2005 | Lin et al. | 331/176 |
| 2005/0219003 | A1 * | 10/2005 | Urakawa | 331/117 R |
| 2008/0036544 | A1 * | 2/2008 | Wang | 331/16 |

* cited by examiner

*Primary Examiner* — Ryan Johnson
(74) *Attorney, Agent, or Firm* — Winston Hsu; Scott Margo

(57) ABSTRACT

An oscillator calibration apparatus includes a counter, a comparator and an adjusting unit. The counter is utilized for receiving a first clock signal and a second clock signal, and utilizing the first clock signal to sample the second clock signal to generate at least one counting value, where the first clock signal is generated from a first oscillator, and the second clock signal is generated from a second oscillator different from the first oscillator; the comparator is coupled to the counter, and is utilized for comparing the counting value with a predetermined value to generate at least one calibration signal; and the adjusting unit is coupled to the comparator, and is utilized for adjusting a frequency of the second oscillator according to the calibration signal.

10 Claims, 3 Drawing Sheets

OSCILLATOR CALIBRATION APPARATUS AND OSCILLATOR CALIBRATION METHOD

BACKGROUND OF THE INVENTION

1. Field of the Invention

The present invention relates to an oscillator calibration apparatus, and more particularly, to an oscillator calibration apparatus applied in an electronic device which utilizes two oscillators for operations.

2. Description of the Prior Art

In some mobile phones that have a memory in pixel (MIP) function or an active matrix organic light emitting diode (AMOLED) application, the driver integrated circuit (IC) built therein may have two oscillators with different respective frequencies. The oscillator with the faster frequency (e.g. 10 MHz) is used for the normal operations of the mobile phone; the oscillator with the slower frequency (e.g. 10 KHz) is used when the mobile phone is operated under a power-saving mode such as a hold mode in a MIP driver and a dimmed low power mode in a AMOLED driver.

Due to semiconductor process variations, the oscillators of the driver IC need to be calibrated before being delivered to the client. Calibrating the slower oscillator is time consuming, and the test cost is therefore increased.

SUMMARY OF THE INVENTION

It is therefore an objective of the present invention to provide an oscillator calibration apparatus and associated method, which can utilize a calibrated oscillator having a faster frequency to calibrate another oscillator having a slower frequency, so the slower oscillator does not need to be calibrated by the manufacturers, thereby solving the above-mentioned problem.

According to one embodiment of the present invention, an oscillator calibration apparatus comprises a counter, a comparator and an adjusting unit. The counter is utilized for receiving a first clock signal and a second clock signal, and the first clock signal is utilized to sample the second clock signal to generate at least one counting value. The first clock signal is generated from a first oscillator, and the second clock signal is generated from a second oscillator different from the first oscillator. The comparator is coupled to the counter, and is utilized for comparing the counting value with a predetermined value to generate at least one calibration signal. The adjusting unit is coupled to the comparator, and is utilized for adjusting a frequency of the second oscillator according to the calibration signal.

According to another embodiment of the present invention, an oscillator calibration method comprises: receiving a first clock signal and a second clock signal, and utilizing the first clock signal to sample the second clock signal to generate at least one counting value. The first clock signal is generated from a first oscillator, and the second clock signal is generated from a second oscillator different from the first oscillator. The counting value is compared with a predetermined value to generate at least one calibration signal, and a frequency of the second oscillator is adjusted according to the calibration signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
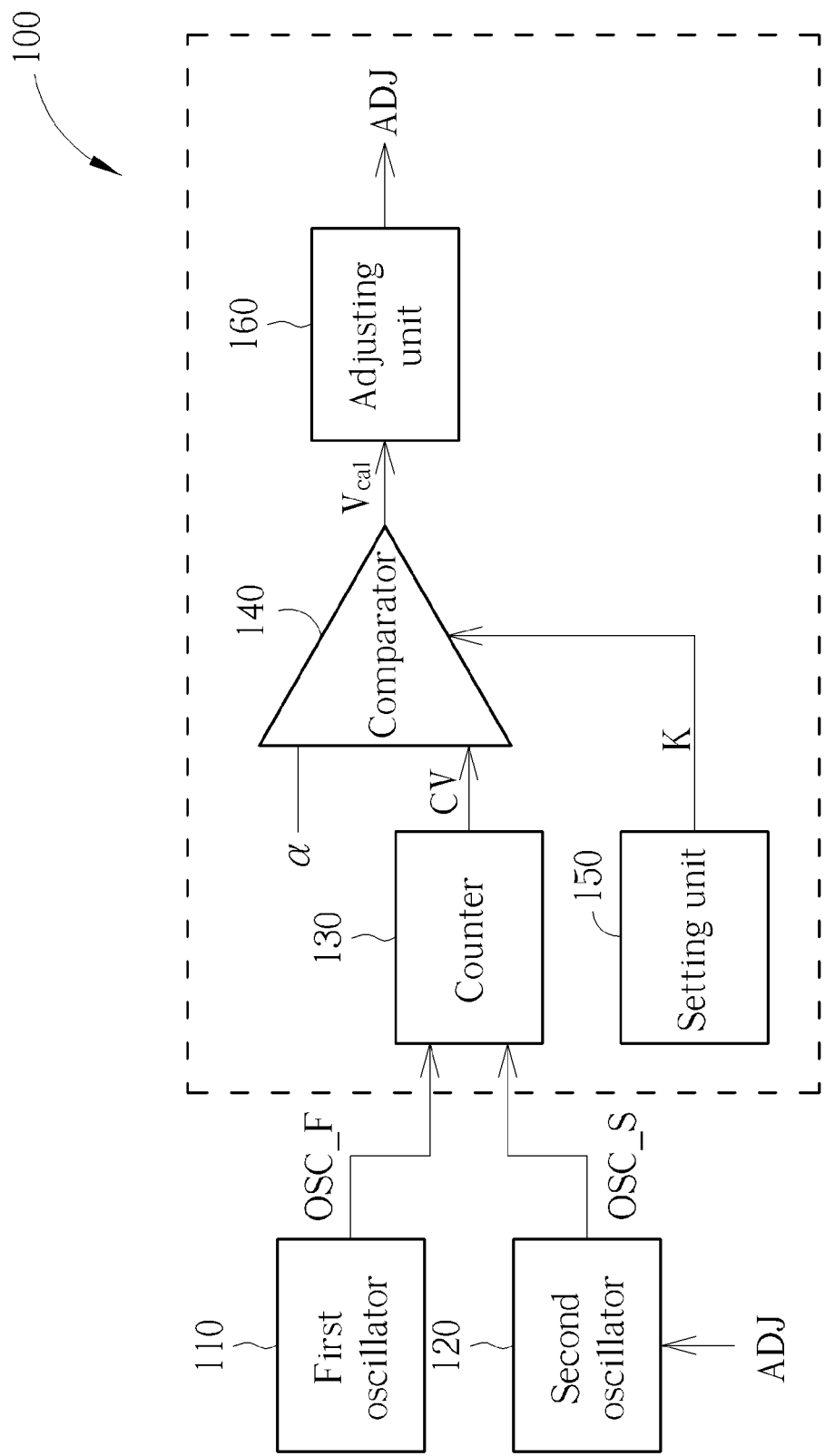
FIG. 1 is a diagram illustrating an oscillator calibration apparatus according to one embodiment of the present invention.

Please refer to FIG. 1, which is a diagram illustrating an oscillator calibration apparatus 100 according to one embodiment of the present invention. As shown in FIG. 1, the oscillator calibration apparatus 100 comprises a counter 130, a comparator 140, a setting unit 150 and an adjusting unit 160. In this embodiment, the oscillator calibration apparatus 100 is built in a driver IC applied in a mobile phone.

In this embodiment, the oscillator calibration apparatus 100 is coupled to a first oscillator 110 and a second oscillator 120. The first oscillator 110 is used for generating a first clock signal OSC_F which has a faster frequency such as 10 MHz, and the second oscillator 120 is used for generating a second clock signal OSC_S which has a slower frequency such as 10 KHz. In addition, the first oscillator 110 has been calibrated at the factory stage and therefore has a precise frequency; the second oscillator 120, however, has not been calibrated at the factory stage, and its frequency may not be the required frequency.

Furthermore, in this embodiment, the first clock signal OSC_F generated from the first oscillator 110 is used for the normal operations of the mobile phone, such as for providing a logic clock, pumping clock or backlight clock etc. The second clock signal OSC_S generated from the second oscillator 120 is used when the mobile phone is operated under the power-saving mode such as a hold mode in a MIP application and a dimmed low power mode in an AMOLED application.

Figure 2:
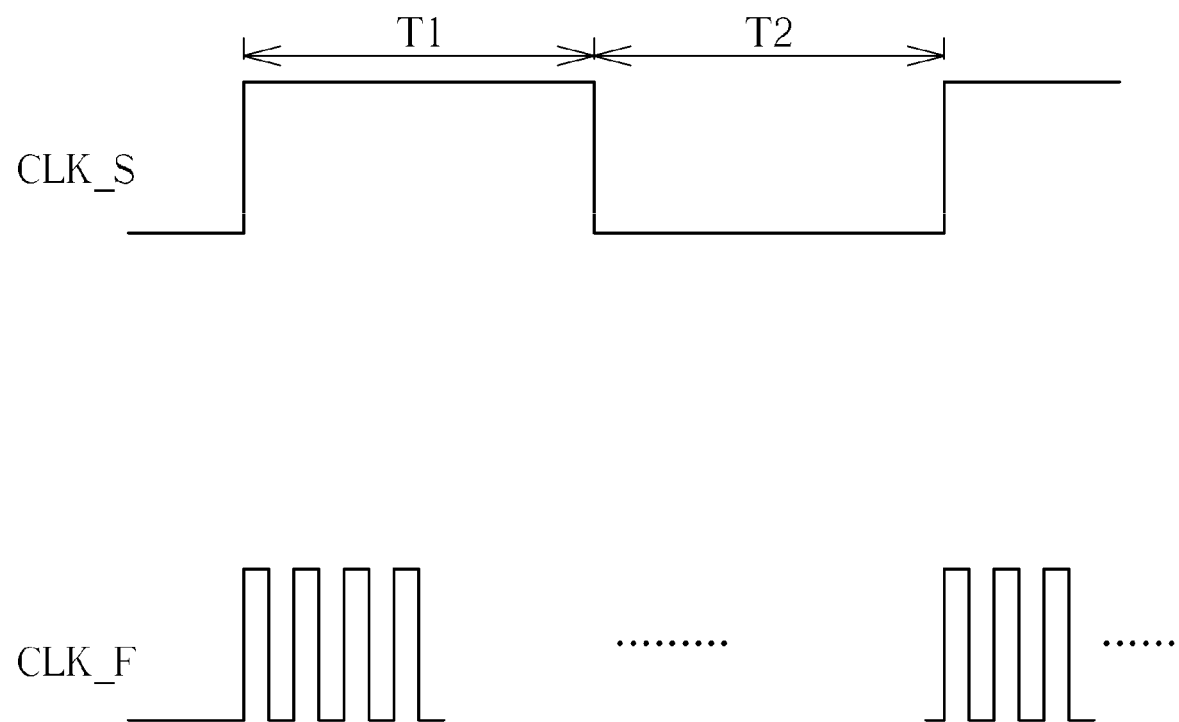
FIG. 2 illustrates how the first clock signal is used to sample the second clock signal according to one embodiment of the present invention.

In the operations of the oscillator calibration apparatus 100, the counter 130 receives the first clock signal OSC_F and the second clock signal OSC_S, and uses the first clock signal OSC_F to sample the second clock signal OSC_S to generate a counting value CV. Please refer to FIG. 2, which shows how the first clock signal OSC_F is used to sample the second clock signal OSC_S according to one embodiment of the present invention. As shown in FIG. 2, the counter 130 can use the first clock signal OSC_F to count how many cycles of the first clock signal OSC_F are within the period T1 or the period T2 to generate the counting value CV.

The comparator 140 compares the counting value with a predetermined value a to generate a calibration signal Vcal, where the predetermined value a is a desired counting value CV. For example, if the desired frequencies of the first oscillator 110 and the second oscillator 120 are 10 MHz and 10 KHz, respectively, the predetermined value α should be set as "1000".

The adjusting unit 160 receives the calibration signal Vcal and generates a control signal ADJ according to the calibration signal Vcal to adjust the frequency of the second oscillator 120. For example, if the calibration signal Vcal indicates that the frequency of the second oscillator 120 is slower than the desired frequency (i.e. the counting value CV is less than the predetermined value α), the adjusting unit 160 generates the control signal ADJ to increase the frequency of the second oscillator 120; if the calibration signal Vcal indicates that the frequency of the second oscillator 120 is faster than the desired frequency (i.e. the counting value CV is greater than the predetermined value α), the adjusting unit 160 generates the control signal ADJ to decrease the frequency of the second oscillator 120.

In another embodiment, to avoid interference noise, the counter may repeat the above-mentioned counting steps (i.e. using the first clock signal to sample the second clock signal) many times to generate a plurality of counting values CV. The comparator 140 compares the counting values CV with the predetermined value, respectively, to generate a plurality of calibration signals Vcal, and the adjusting unit 160 adjusts the frequency of the second oscillator 120 by referring to the plurality of calibration signals Vcal; that is, the adjusting unit 160 does not adjust the frequency of the second oscillator 120 until the plurality of calibration signals are generated and received.

The above-mentioned calibration steps are arranged to adjust the frequency of the second oscillator 120 each time the mobile phone is powered on. In other words, the calibration steps are performed in a power on flow (about 120 ms) of the mobile phone.

In addition, in some situations where a panel manufacturer or mobile phone manufacturer may individually change the frequency of the first oscillator 110, e.g., from 10 MHz to 11 MHz, the operations of the comparator 140 also need to be changed to avoid generating error calibration signals. To solve this problem, the setting unit 150 provides a comparison ratio K to the comparator 140, where the comparison ratio K is in response to the frequency of the first clock signal 110. For example, if the frequency of the first oscillator 110 is changed from 10 MHz to 11 MHz, the comparison ratio K is set to be "1.1"; and if the frequency of the first oscillator 110 is changed from 10 MHz to 12 MHz, the comparison ratio K is set to be "1.2". Then, the comparator 140 uses the comparison ratio K to adjust the counting value CV to generate an adjusted counting value (e.g. dividing the counting value CV by the comparison ratio K), and compares the adjusted counting value with the predetermined value α to generate the calibration signal Vcal.

It should be noted that the above-mentioned values and calculation methods concerning the comparison ratio K and the adjusted counting value are for illustrative purposes only, and should not be taken as limitations of the present invention.

Figure 3:
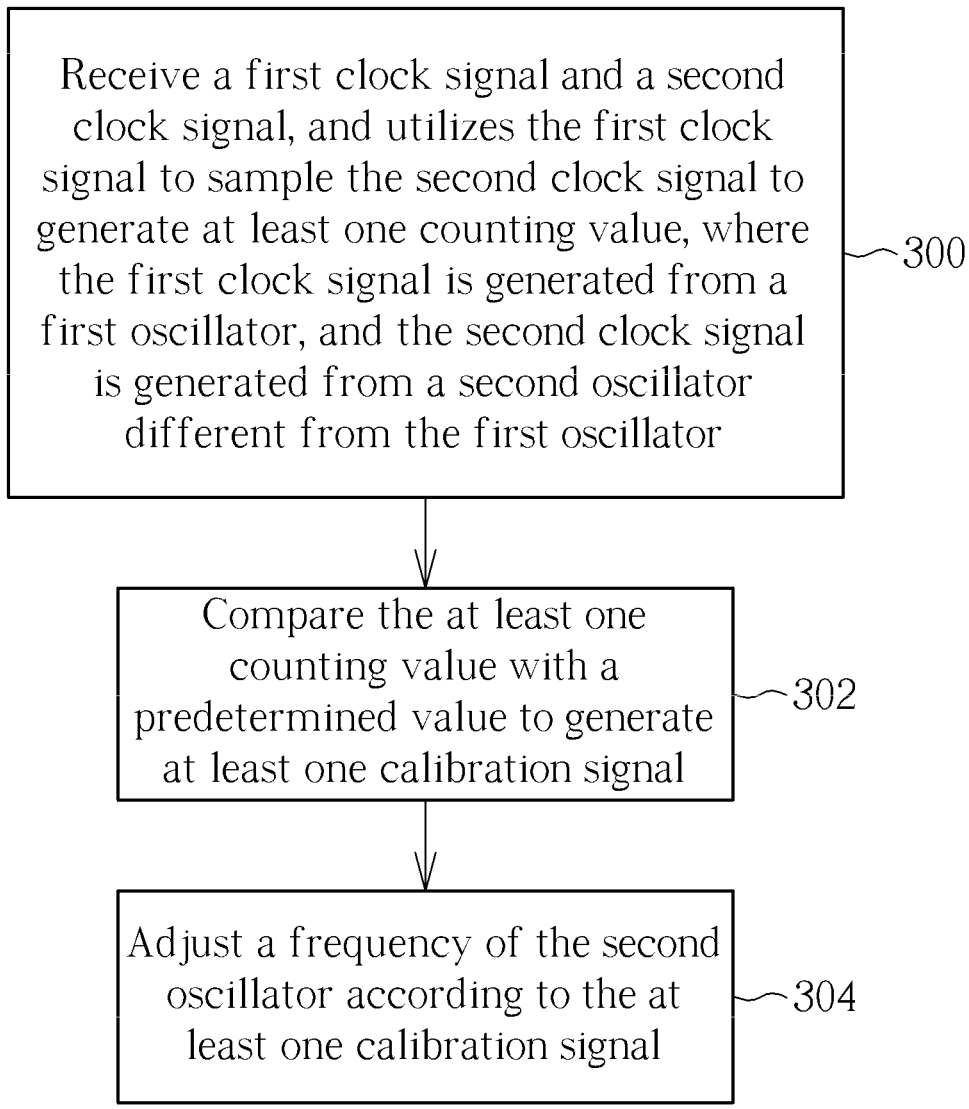
FIG. 3 is a flowchart of an oscillator calibration method according to one embodiment of the present invention.

Please refer to FIG. 3, which is a flowchart of an oscillator calibration method according to one embodiment of the present invention. Referring to FIG. 3 the flow is described as follows:

Step 300: Receive a first clock signal and a second clock signal, and utilize the first clock signal to sample the second clock signal to generate at least one counting value, where the first clock signal is generated from a first oscillator, and the second clock signal is generated from a second oscillator different from the first oscillator.

Step 302: Compare the counting value with a predetermined value to generate at least one calibration signal.

Step 304: Adjust a frequency of the second oscillator according to the calibration signal.

Briefly summarized, in the oscillator calibration apparatus and associated method of the present invention, a calibrated oscillator having a faster frequency is used to calibrate another oscillator having a slower frequency each time the mobile phone is powered on. Therefore, the oscillator with the slower frequency does not need to be calibrated at the factory stage, and the test cost is therefore decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator calibration apparatus, comprising:
   a counter, for receiving a first clock signal and a second clock signal, and utilizing the first clock signal to sample the second clock signal to generate at least one counting value, where the first clock signal is generated from a first oscillator, and the second clock signal is directly outputted from a second oscillator different from the first oscillator;
   a comparator, coupled to the counter, for comparing the counting value with a predetermined value to generate at least one calibration signal; and
   an adjusting unit, coupled to the comparator, outputting a signal to the second oscillator for adjusting a frequency of the second oscillator directly according to the calibration signal;
   wherein the comparator utilizes a comparison ratio to adjust the counting value to generate an adjusted counting value, and the comparator compares the adjusted counting value with the predetermined value to generate the calibration signal.

2. The oscillator calibration apparatus of claim 1, wherein the counter utilizes the first clock signal to sample the second clock signal to generate a plurality of counting values, the comparator compares the counting values with the predetermined value, respectively, to generate a plurality of calibration signals, and the adjusting unit does not adjust the frequency of the second oscillator until the plurality of calibration signals are generated.

3. The oscillator calibration apparatus of claim 1, further comprising:
   a setting unit, coupled to the comparator, for setting the comparison ratio as a response to a change in frequency of the first clock signal.

4. The oscillator calibration apparatus of claim 1, wherein the oscillator calibration apparatus is applied to a mobile phone; and is arranged to adjust the frequency of the second oscillator each time the mobile phone is powered on, wherein the oscillator calibration apparatus only adjusts the frequency of the second oscillator in a power on flow of the mobile phone, and does not adjust the frequency of the second oscillator during a normal operation of the mobile phone.

5. An oscillator calibration method, comprising:
   receiving a first clock signal and a second clock signal, and utilizing the first clock signal to sample the second clock signal to generate at least one counting value, where the first clock signal is generated from a first oscillator, and the second clock signal is directly outputted from a second oscillator different from the first oscillator;

comparing the counting value with a predetermined value to generate at least one calibration signal; and outputting a signal to the second oscillator for adjusting a frequency of the second oscillator directly according to the calibration signal;

wherein the step of comparing the counting value with the predetermined value to generate the calibration signal comprises:

utilizing a comparison ratio to adjust the counting value to generate an adjusted counting value; and comparing the adjusted counting value with the predetermined value to generate the calibration signal.

6. The oscillator calibration method of claim 5, wherein the step of utilizing the first clock signal to sample the second clock signal to generate the counting value comprises:

utilizing the first clock signal to sample the second clock signal to generate a plurality of counting values; and the step of comparing the counting value with the predetermined value to generate the calibration signal comprises:

comparing the counting values with the predetermined value, respectively, to generate a plurality of calibration signals; and the step of adjusting the frequency of the second oscillator according to the calibration signal comprises:

not adjusting the frequency of the second oscillator until the plurality of calibration signals are generated.

7. The oscillator calibration method of claim 5, further comprising:

setting the comparison ratio as a response to a change in frequency of the first clock signal.

8. The oscillator calibration method of claim 5, wherein the oscillator calibration method is applied to a mobile phone; and is arranged to adjust the frequency of the second oscillator each time the mobile phone is powered on; wherein the oscillator calibration method is arranged to adjust the frequency of the second oscillator only in a power on flow of the mobile phone, and is not arranged to adjust the frequency of the second oscillator during a normal operation of the mobile phone.

9. An oscillator calibration apparatus, comprising:

a counter, for receiving a first clock signal and a second clock signal, and utilizing the first clock signal to sample the second clock signal to generate at least one counting value, where the first clock signal is generated from a first oscillator, and the second clock signal is directly outputted from a second oscillator different from the first oscillator;

a comparator, coupled to the counter, for comparing the counting value with a predetermined value to generate at least one calibration signal; and an adjusting unit, coupled to the comparator, outputting a signal to the second oscillator for adjusting a frequency of the second oscillator directly according to the calibration signal;

wherein the oscillator calibration apparatus is applied to a mobile phone; and is arranged to adjust the frequency of the second oscillator each time the mobile phone is powered on, wherein the oscillator calibration apparatus only adjusts the frequency of the second oscillator in a power on flow of the mobile phone, and does not adjust the frequency of the second oscillator during a normal operation of the mobile phone.

10. An oscillator calibration method, comprising:

receiving a first clock signal and a second clock signal, and utilizing the first clock signal to sample the second clock signal to generate at least one counting value, where the first clock signal is generated from a first oscillator, and the second clock signal is directly outputted from a second oscillator different from the first oscillator;

comparing the counting value with a predetermined value to generate at least one calibration signal; and outputting a signal to the second oscillator for adjusting a frequency of the second oscillator directly according to the calibration signal;

wherein the oscillator calibration method is applied to a mobile phone; and is arranged to adjust the frequency of the second oscillator each time the mobile phone is powered on; wherein the oscillator calibration method is arranged to adjust the frequency of the second oscillator only in a power on flow of the mobile phone, and is not arranged to adjust the frequency of the second oscillator during a normal operation of the mobile phone.

\* \* \* \* \*